US008127242B1

(12) United States Patent
Su

(10) Patent No.: US 8,127,242 B1
(45) Date of Patent: Feb. 28, 2012

(54) GRAPHIC USER INTERFACE AND SOFTWARE FOR PROCESSING LARGE SIZE SIGNAL DATA SAMPLES IN A SMALL BUFFER USING AUTOMATICALLY ADJUSTED DECIMATION RATIO

(75) Inventor: Wei Su, Englishtown, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 33 days.

(21) Appl. No.: 12/807,372

(22) Filed: Aug. 12, 2010

(51) Int. Cl.
G06F 3/048 (2006.01)
G06F 3/00 (2006.01)

(52) U.S. Cl. ....... 715/771; 702/68; 345/440.1; 345/440; 345/442

(58) Field of Classification Search .................. 715/771; 345/440.1, 440; 702/68
See application file for complete search history.

(56) References Cited

U.S. PATENT DOCUMENTS

| | | | | |
|---|---|---|---|---|
| 3,551,891 A | | 12/1970 | Thieme et al. .................. 703/13 |
| 4,316,282 A | * | 2/1982 | Macina .......................... 370/484 |
| 4,700,226 A | * | 10/1987 | Acampora ............... 375/240.05 |
| 5,051,981 A | * | 9/1991 | Kline ............................. 370/290 |
| 5,204,969 A | * | 4/1993 | Capps et al. .................. 704/278 |
| 5,311,309 A | * | 5/1994 | Ersoz et al. .............. 375/240.12 |
| 5,347,622 A | * | 9/1994 | Takemoto et al. ............ 345/629 |
| 5,499,110 A | | 3/1996 | Hosogai ........................ 358/450 |
| 5,502,789 A | | 3/1996 | Akagiri .......................... 704/204 |
| 5,502,807 A | * | 3/1996 | Beachy .......................... 345/473 |
| 5,517,105 A | * | 5/1996 | Holzwarth ................ 324/121 R |
| 5,528,301 A | * | 6/1996 | Hau et al. ...................... 348/441 |
| 5,528,356 A | | 6/1996 | Harcourt ....................... 356/73.1 |
| 5,917,733 A | | 6/1999 | Bangham ...................... 708/300 |
| 6,041,339 A | * | 3/2000 | Yu et al. ........................ 708/313 |
| 6,229,536 B1 | | 5/2001 | Alexander et al. ......... 345/440.1 |
| 6,300,973 B1 | * | 10/2001 | Feder et al. ................. 348/14.09 |
| 6,317,765 B1 | * | 11/2001 | Page et al. ..................... 708/313 |
| 6,351,765 B1 | * | 2/2002 | Pietropaolo et al. .......... 709/218 |
| 6,484,111 B1 | * | 11/2002 | Nara ............................... 702/77 |
| 6,559,868 B2 | | 5/2003 | Alexander et al. ............ 715/781 |
| 6,567,760 B1 | | 5/2003 | Kikuchi et al. ................. 702/67 |
| 6,643,416 B1 | * | 11/2003 | Daniels et al. ................ 382/299 |
| 6,690,878 B1 | * | 2/2004 | Jeong et al. ................... 386/240 |
| 6,751,006 B2 | * | 6/2004 | Zhou et al. .................... 359/291 |

(Continued)

FOREIGN PATENT DOCUMENTS

JP 2001-283536 A 10/2001

*Primary Examiner* — Steven B Theriault
(74) *Attorney, Agent, or Firm* — Michael Zalenka; Stephen J. Harbulak

(57) ABSTRACT

A method for rapidly analyzing and editing data files with a number GUI's and an adaptive decimation ratio in a computer allows processing data files and signal data files within a given data segment for a better fit into a limited-size working space buffer and provides improved resolution of data segments in a simplified way using GUI's that allow the user to point and click at a computer screen instead of performing manual calculations. A large data segment is adaptively decimated to a smaller size automatically so that a lower resolution version of the data segment will be loaded into a fixed-size small buffer in hardware working space for further data editing. The decimation and loading process will be repeated until the user finds the desired data-section of interest.

66 Claims, 6 Drawing Sheets

U.S. PATENT DOCUMENTS

| | | | |
|---|---|---|---|
| 6,768,430 B1* | 7/2004 | Weinstein | 341/61 |
| 6,912,327 B1* | 6/2005 | Hori et al. | 382/305 |
| 6,989,833 B2 | 1/2006 | Narita | 345/440.1 |
| 6,993,546 B2* | 1/2006 | Nally et al. | 708/313 |
| 7,010,551 B2 | 3/2006 | Terayama et al. | 707/200 |
| 7,119,845 B2* | 10/2006 | Lafon | 348/441 |
| 7,343,084 B2* | 3/2008 | Kishi et al. | 386/343 |
| 2002/0015092 A1* | 2/2002 | Feder et al. | 348/14.13 |
| 2002/0048413 A1* | 4/2002 | Kusunoki | 382/282 |
| 2002/0049777 A1 | 4/2002 | Terayama et al. | 707/200 |
| 2002/0080149 A1 | 6/2002 | Alexander et al. | 345/634 |
| 2003/0052875 A1* | 3/2003 | Salomie | 345/419 |
| 2003/0071832 A1 | 4/2003 | Branson | 345/698 |
| 2003/0155922 A1* | 8/2003 | Royle et al. | 324/326 |
| 2003/0179242 A1 | 9/2003 | Alexander et al. | 345/781 |
| 2004/0017366 A1 | 1/2004 | Narita | 345/208 |
| 2004/0022521 A1* | 2/2004 | Kishi et al. | 386/69 |
| 2004/0164984 A1 | 8/2004 | Pickerd | 345/440 |
| 2005/0107998 A1* | 5/2005 | McLernon et al. | 703/22 |
| 2005/0240962 A1* | 10/2005 | Cooper et al. | 725/38 |
| 2005/0248474 A1* | 11/2005 | Wiser et al. | 341/50 |
| 2006/0146185 A1* | 7/2006 | Chen | 348/410.1 |
| 2006/0290695 A1* | 12/2006 | Salomie | 345/420 |
| 2007/0104394 A1* | 5/2007 | Chou | 382/300 |
| 2009/0112957 A1* | 4/2009 | Abramovitch et al. | 708/313 |

* cited by examiner

GRAPHIC USER INTERFACE AND SOFTWARE FOR PROCESSING LARGE SIZE SIGNAL DATA SAMPLES IN A SMALL BUFFER USING AUTOMATICALLY ADJUSTED DECIMATION RATIO

GOVERNMENT INTEREST

The invention described herein may be manufactured, used, imported, sold, and licensed by or for the Government of the United States of America without the payment to me of any royalty thereon.

RELATED INVENTION

This invention is related to a patent application entitled "Method, Computer Program And Apparatus to Analyze Large Size Signal Samples In a Small Buffer Using An Automatically Adjusted Decimation Ratio," which was filed by the inventor herein on Apr. 28, 2003 and assigned U.S. patent application Ser. No. 10/429,350 (the '350 application). In a Notice of Abandonment mailed on Nov. 3, 2007, the '350 application was deemed to be abandoned for applicant's failure to timely file a proper reply to the Office letter mailed on Nov. 28, 2006 in that case. Instead applicant filed a continuation-in-part application assigned application Ser. No. 11/712,163 (the '163 application) and a filing date of Feb. 28, 2007. The '163 application issued as U.S. Pat. No. 7,401,007 on Jul. 15, 2008.

FIELD OF THE INVENTION

The invention generally relates to the reviewing, searching, and editing of data files and digitally sampled signal data files. In particular, the invention relates to Graphical User Interface software, apparatus and methods for processing and analyzing data with an adaptive decimation ratio and without loading the entire data into the working space buffer.

BACKGROUND OF THE INVENTION

Most digitally recorded communication signal files have a very large data size due to the over-sampling and continuous monitoring in signal collection and recording. Generally, some current computer or signal processing equipments afford only a very limited buffer size for data processing. Due to an order of magnitude size disparity between large communication signal files and limited data processing buffer sizes, the review, editing and search of any large communication signal data file with uncertain contents often becomes a very lengthy, tedious, time-consuming and inefficient process. Additionally, the procedures employed by the user are often quite labor intensive. In many signal analysis or signal intelligence applications, only a small section of the entire data file will be important to the operator. Typically, a tedious and time-consuming prescreen routine requires the user to load the large data file on a section by section basis into a small buffer for review until the user finally identifies the data section that is desired. An illustrative example of the difference between the size of a large data file and a limited size working space buffer is a disparity of 100 GB and 100 MB.

Thus, there has been a long-felt need for processes and techniques that overcome the problems, disadvantages, limitations and shortcomings of loading large data files section-by-section into a small buffer for further user review and processing. An adaptive trimming or decimation method could edit or tailor large files efficiently in a fixed-size small buffer. Graphical User Interface software, apparatus and methods used during decimation will satisfy the long-felt need for processes, apparatus and software that overcome the numerous problems, disadvantages, limitations and shortcomings of loading large data files into small buffer areas and the subsequent manual search. The present invention provides a user-friendly Graphical User Interface (GUI) software program to edit data files, including data signal files, with an adaptive decimation ratio that decimates, or trims, the size of the desired large data segment in order to better fit into the buffer for further data processing, without suffering from the disadvantages, shortcomings and limitations of prior art techniques and devices.

SUMMARY OF THE INVENTION

It is an object of the present invention to provide GUI editing software to rapidly analyze and edit data files and signal data files to better fit into the working space buffer for further processing in a less complex way.

It is another object of the present invention to rapidly analyze and edit data files and signal data files with GUI editing software, apparatus and methods to better fit into the working space buffer for further processing in a simplified way with GUI's.

It is still another object of the present invention to rapidly analyze and edit data files and signal data files with GUI editing software, apparatus and methods in connection with adaptively decimating the data segment to better fit into the working space buffer for further processing in a simplified way using GUI's to allow the user to point and click at a computer screen.

It is yet another object of the present invention to provide a storage medium encoded with machine-readable computer program code for rapidly analyzing and editing data files, including digitized signal data files, with GUI editing software in connection with adaptively decimating the data segment to better fit into the working space buffer for further processing and provide improved resolution of data file segments in a simplified way using GUI's to allow the user to point and click at a computer screen instead of performing manual calculations.

These and other objects and advantages can now be attained by this invention's user-friendly GUI computer software program, apparatus and methods that rapidly analyze and edit data files and signal data files within a given data segment for a better fit into the working space buffer to enable further processing and provide improved resolution of data segments in a simplified way using GUI's that allow the user to point and click at a computer screen instead of performing manual calculations. In accordance with the present invention, the large data segment is adaptively decimated to a smaller size automatically so that a lower resolution version of the data segment will be loaded into a fixed-size small buffer in hardware working space for further data editing. The segment size is varying during the GUI data editing, such as zoom in and zoom out, and the decimation ratio is updated automatically based on the variation of segment size. The decimation and loading process will be repeated until the user finds the desired data-section of interest. The best resolution of the data segment is insured during the time of fitting the varying large size data segment into the fixed small size buffer. A number of GUI's such as POPUP MENU, EDIT BLOCK and DISPLAY BLOCK, as well as virtual buttons such as RADIO BUTTON and PUSH BUTTON, provide calculating and editing functions that allow the user to accomplish decimation in a faster and simpler way than current methods and programs. The GUI's of the present invention allow a soldier or other non-engineering technical user to initiate complex calculations with point and click computer software without any user intervention and thereby simplify the required calculations.

The present invention also contemplates a storage medium encoded with machine-readable computer program code for rapidly analyzing and editing data files with GUI's and an adaptive decimation ratio and an apparatus for rapidly analyzing and editing data files with GUI's and an adaptive decimation ratio. The methods and other embodiments of the present invention process both signal data files and data files. This inventor's related patent application entitled "Method, Computer Program And Apparatus to Analyze Large Size Signal Samples In a Small Buffer Using An Automatically Adjusted Decimation Ratio," was assigned U.S. patent application Ser. No. 10/429,350 (the '350 application) and is hereby incorporated by reference. In a Notice of Abandonment mailed on Nov. 3, 2007, the '350 application was deemed to be abandoned for applicant's failure to timely file a proper reply to the Office letter mailed on Nov. 28, 2006 in that case. Instead applicant filed a continuation-in-part application assigned application Ser. No. 11/712,163 (the '163 application) and a filing date of Feb. 28, 2007. The '163 application issued as U.S. Pat. No. 7,401,007 on Jul. 15, 2008.

DETAILED DESCRIPTION OF THE PREFERRED EMBODIMENTS

Figure 1:
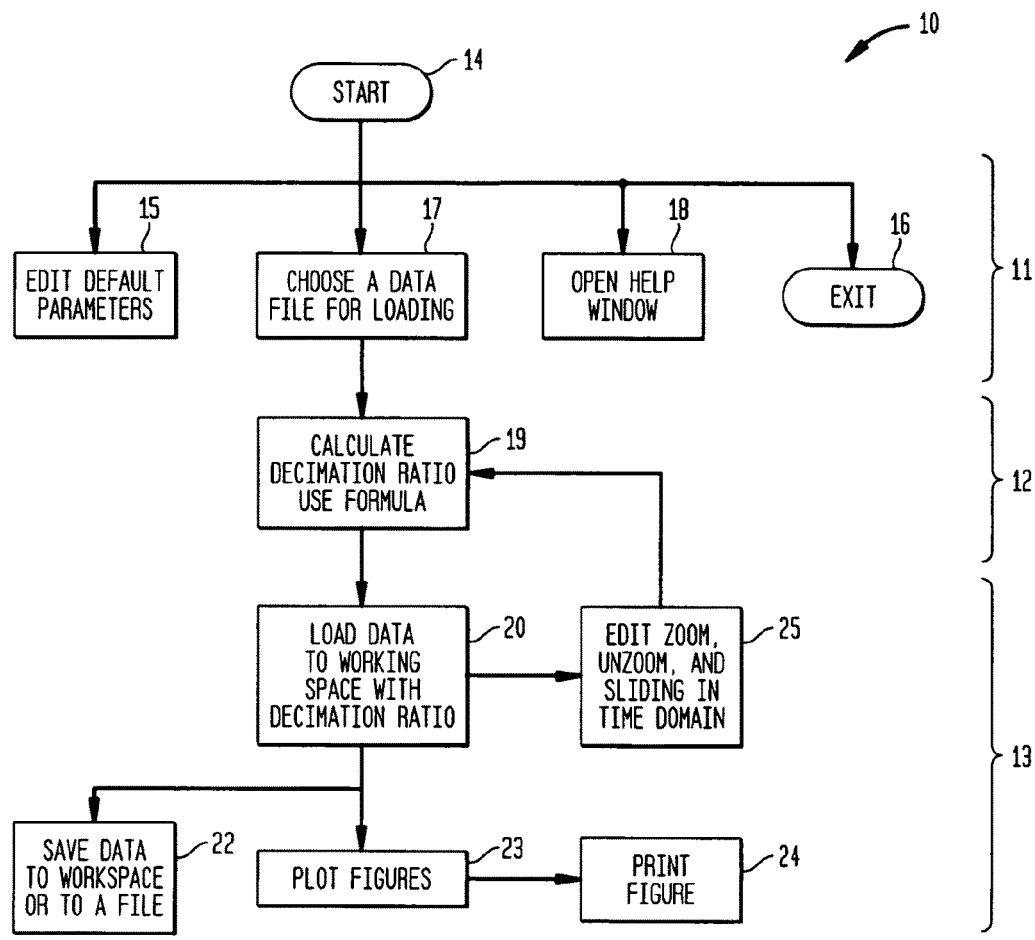
FIG. 1 is a computer programming flow chart illustrating the overall operation of the GUI software, apparatus and methods of the present invention.

Referring now to the drawings, FIG. 1 illustrates the overall operation of this invention's method for rapidly analyzing and editing data files with a plurality of Graphical User Interfaces (GUI's) and an adaptive decimation ratio in a computer. The first part of the process is a selection step 11, followed by a calculation step 12 and then a loading to buffer step 13. The selection step 11 further comprises choosing a data segment with known data format and data type for analysis, which is represented by Block 17. The user may edit default parameters in Block 15, exit in Block 16 or open a help window in Block 18.

During the calculation step 12, the method and computer program of this invention calculates a decimation ratio with a real data formula or a complex data formula, as the case may be. A real number has only one data sample. A complex number has two data samples, which are a real data sample and an imaginary data sample. In the first case of the real number, where d, is a real data sample in the data file, and i=1, 2, ..., $L_1$ is an integer, this equation represents a data file segment with M data samples that is loaded into a computer's working space buffer for processing:

$$d_p, d_{p+1}, d_{p+2}, \ldots, d_{p+M-1}, p \geq 1, p+M-1 \leq L_1, \text{ and } M >> 1, \quad (1)$$

If the data has B bytes resolution per sample, we have M×B bytes for M samples in the segment. Calculating the decimation ratio is based on the data and buffer sizes. Furthermore, if the buffer has only limited W bytes of space and W<<M×B, then M data samples will be decimated to a smaller size in order to fit the working space buffer. During the Block 19 calculating the decimation ratio step the adaptive decimation ratio is calculated. During the Block 19 calculating step, the real data decimation ratio $R_1$ will be calculated according to the following equation:

$$R_1 = \begin{cases} 1 & \text{if } R_{10} = 0 \\ R_{10} & \text{if } R_{10} \geq 1 \end{cases} \quad (2)$$

where $$R_{10} = \text{ceil}\left(\frac{M}{W_1}\right) \; W_1 = \text{floor}\left(\frac{W}{B}\right)$$

where the operator ceil(x) rounds the elements of x to the nearest integers towards infinity, the operator floor(x) rounds the input data x to the nearest integers towards minus infinity and the buffer size W is defined by the user based on the application. The M data samples in Equation 2 will be decimated to a W number of decimated data segments according to this equation:

$$D_1 = [d_p d_{p+R_1} d_{p+2R_1} \ldots d_{p+(W-1)R_1}]^T \quad (3)$$

with the real data decimation ratio of $R_1$, where T represents matrix transpose. The real data decimation ratio $R_1$ will be calculated adaptively using Equation 2 and the vector $D_1$ will be updated whenever the parameters p or M vary.

In the case of complex data, the data file is denoted by $d_{i1}+jd_{i2}$ in which j is the imaginary number, where i=1, 2, ..., $L_2$ are integers and $L_2$ is an even integer, and each sample in the data file has a pair of elements as follows:

$$d_{q,1}, d_{q,2}, d_{q+1,1}, d_{q+1,2}, \ldots, d_{q+N-1,1}, d_{q+N-1,2}, \text{ where } q \text{ is the index of summation and } q \geq 1, q+N-1 \leq L_2, \text{ and } N >> 1 \quad (4)$$

If the data has B bytes resolution per sample, we have 2N×B bytes for N number of complex data samples. If the working space buffer has only limited W bytes of space and W<<N, the N number of complex data samples will be decimated to a smaller size in order to fit the working space buffer in accordance with the methods of this invention. The complex data decimation ratio $R_2$ will be calculated according to the following equation:

$$R_2 = \begin{cases} 1 & \text{if } R_{20} = 0 \\ R_{20} & \text{if } R_{20} \geq 1 \end{cases} \quad (5)$$

where

-continued
$$R_{20} = \text{ceil}\left(\frac{N}{W_2}\right) \quad W_2 = \text{floor}\left(\frac{W}{2B}\right)$$

The N-pair complex samples in equation 4 will be decimated to a $W_2$-pair of complex samples with the complex data decimation ratio of $R_2$. The N-pair samples in (4), can be defined by using indices p as shown in the following equation:

$$d_p, d_{p+1}, d_{p+2}, \ldots, d_{p+2N-1}, \text{ with } p \geq 1, p+2N-1 \leq L_2, \text{ and } N \gg 1 \quad (6)$$

The decimated data of equation (6) will be represented by a $W_2$ by a two-dimensional matrix according to the equation:

$$D_2 = \begin{bmatrix} d_p & d_{p+2R_2} & d_{p+4R_2} & \cdots & d_{p+2(W_2-1)R_2} \\ d_{p+1} & d_{p+2R_2+1} & d_{p+4R_2+1} & \cdots & d_{p+2(W_2-1)R_2+1} \end{bmatrix}^T \quad (7)$$

The Block 19 calculation step allows loading the selected data segment into a limited size buffer in the working space. During the loading step 13, the data segment or signal data segment is chosen and decimated from the file to the buffer with the decimation ratio, which is represented by Block 20. If the edit, zoom, un-zoom, or sliding operations of Block 25 are used, the decimation ratio will be automatically adjusted and re-calculated in Block 19 to furnish the highest resolution and the data segments to be decimated and loaded in Block 20 according to the adaptive decimation ratio. The data in the current working space can be plotted in Block 23 for editing, the plotted data figures can be printed in Block 24 for documentation and the data in the buffer can be saved to a file for the future use in Block 22. The GUI options for default parameter edit, help, and exit in Blocks 15, 16 and 18 are available at all times. When the default parameter edit option of Block 15 is selected, a list of default data such as buffer size and sliding overlap size will be displayed to user for modification. When the Block 18 help window option is selected, the help text will be displayed to the user describing GUI functions. If the Block 16 exit option is chosen, the program will be terminated after clearing the working space and closing all figures.

Figure 2:
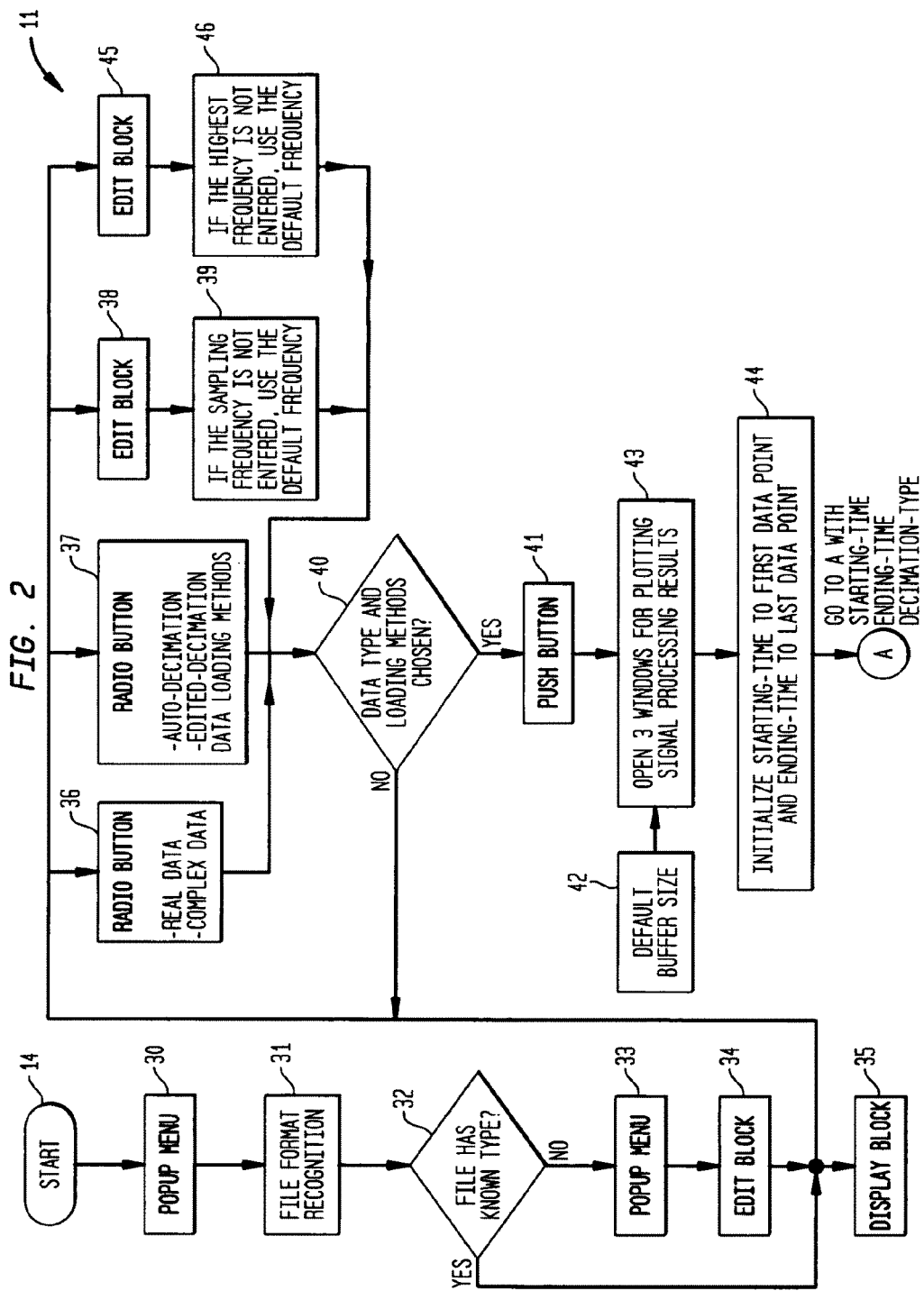
FIG. 2 is a computer programming flow chart including a number of GUI's and illustrating the initial operations of the GUI software, apparatus and methods of the present invention including the process of choosing a file, choosing a file format, defining data type, defining the decimation ratio and opening plotting windows in accordance with the present invention.

Now referring to FIG. 2, the data segment selection step 11 further comprises a number of operations that start with selecting the data segment from a means for data storage. Block 30 represents choosing a file name from a list of file names by clicking on a file format recognition POPUP MENU GUI, with bold capitol letters intentionally selected to differentiate GUI's and virtual buttons from other aspects of this invention in the specification and drawings, e.g. Block 30 POPUP MENU is a GUI. The GUI software program of the present invention will recognize the format of the chosen file in Block 31. In Block 32 the software inquires whether the file format is known, and if the file type is unknown, the precision-type of the file will be selected by clicking from an option list on a file type recognition GUI POPUP MENU in Block 33. In those cases when the file precision-type is not listed in the menu, the user can type that information into a GUI display EDIT BLOCK 34. After determining the file format, the file size is detected by this invention's software and the file header is displayed in a file size GUI DISPLAY BLOCK 35. As discussed above, the data type could be either real data or complex data, which can be selected in decimation type virtual RADIO BUTTON GUI 36. If it is a complex signal, both the real parts and imaginary parts will be read accordingly. The sampling rate or frequency is typed in the GUI display EDIT BLOCK 38. If the sampling rate is not entered, a default value will be assigned in a default frequency editing GUI EDIT BLOCK 45, instructing the user to type in the highest frequency.

The decimation type is selected by virtual RADIO BUTTON 37 and can be either Auto-Decimation or Edited-Decimation. When the Edited-Decimation option is chosen, the software's adaptive decimation will be disabled and the data segment will be decimated and loaded to working space with the given decimation ratio. In this case, the size of decimated data segment may be larger than the size of the buffer so that the size of the segment may be cut shorter and may not display the entire waveform envelope, where waveform is defined as the data sample values versus the sample index of the data segment. When Auto-Decimation is selected, the decimation ratio will be calculated automatically using the real data equation (2) or the complex data equation (5) to ensure the decimated data loaded into the working space buffer in subsequent operations is distributed evenly in the data segment so that the entire waveform envelope may be viewed in a lower-resolution.

Block 40 inquires whether the data types and loading methods have been chosen. After determining the data type and decimation type, the data segment is loaded to the buffer by clicking on a loading virtual PUSH BUTTON GUI 41. Windows for plotting and analyzing data waveforms will then be generated on the computer screen in Block 43. For example, in the case of signal processing: the plots will be time versus magnitude, time versus frequency, frequency versus magnitude, and frequency versus phase. The initial starting-time and ending-time are chosen for data loading in Block 44. The data segment is defined by starting-time and ending-time. The description of the data loading process continues at Point A in FIG. 3.

Figure 3:
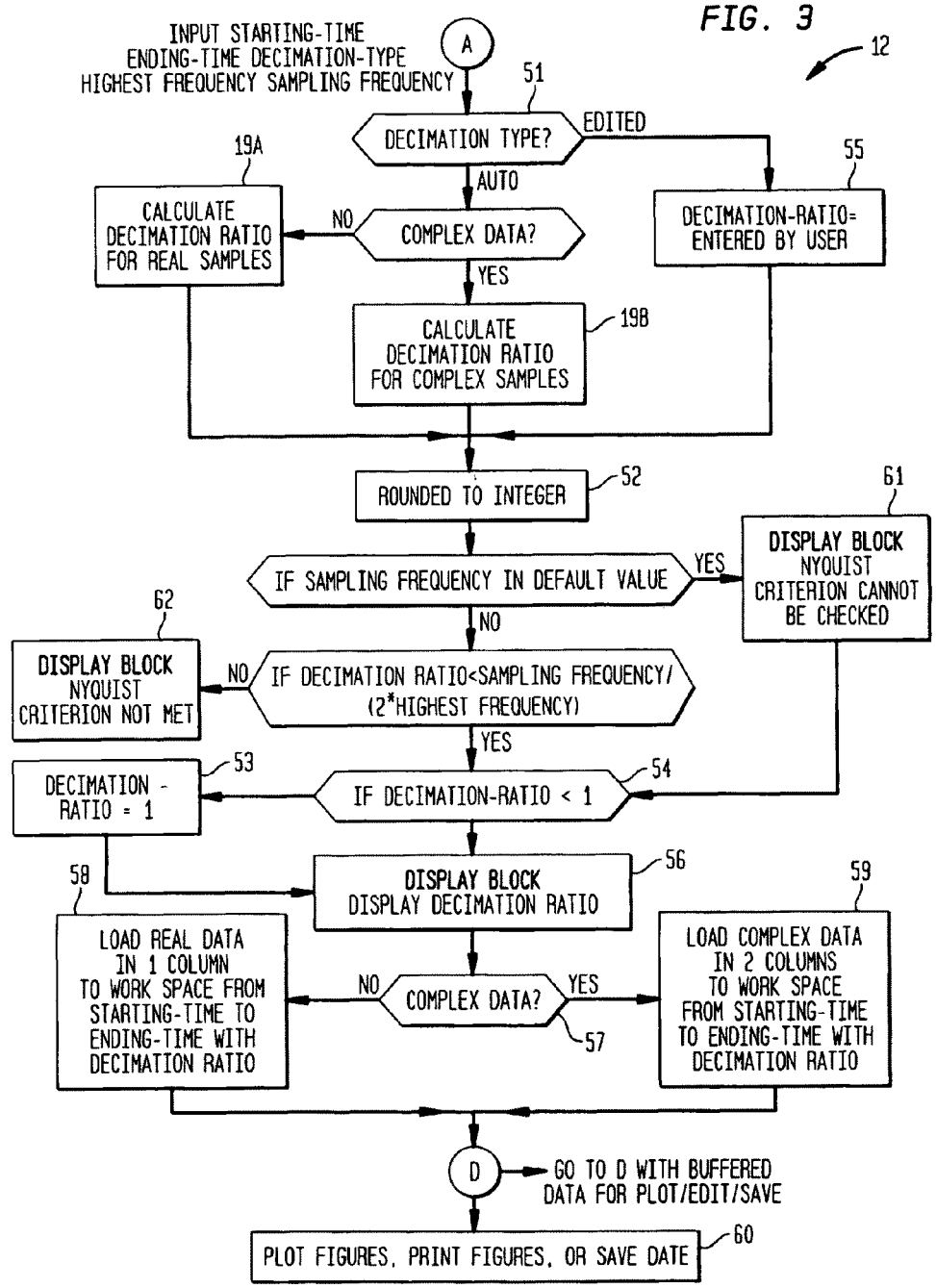
FIG. 3 is a computer programming flow chart including a number of GUI's and illustrating the process of loading real data or complex data with a decimation ratio in accordance with the present invention.

Referring now to FIG. 3, there is depicted the calculation step 12 in greater detail, beginning at Point A. In accordance with the present invention, the decimated data loading process is continually repeated each time whenever the size of data segment is changed, which is whenever the value of starting-time or the value of ending-time is updated due to the editing of data waveform. Decimation Type Block 51 asks whether the auto-decimation or edited decimation process is used. If a user selected Decimation Ratio in Block 55 is not available, then auto-decimation will be enabled to calculate the decimation ratio, using the real data equation (2) or the complex data equation (5). After calculating the decimation-ratio, the satisfactory of Nyquist Criterion is checked in Block 53. If it is not satisfied, a warning will be reported in DISPLAY BLOCK 62. It should be noted that the purpose of adaptive decimation is to limit the data size while keeping the waveform envelop. Therefore, the violation of Nyquist Criterion is allowed during the data editing. However, before saving the data, Block 22, Nyquist Criterion has to be met to ensure the correct data sampling. If it is not, a zoom-in option or a user entered decimation-ration will be applied. The decimation ratio should be rounded to an integer in Block 52 and should not be less than 1 in Block 54. The decimation ratio will be displayed to the user for reference in a display decimation ratio GUI DISPLAY BLOCK 56. Next, if the data or signal file is collected as complex numbers, both real parts and imaginary parts need to be decimated and loaded in Block 59, where the complex data is loaded into 2 columns to the work space from the starting-time to the ending-time with the decimation ratio. Similar to the windows displaying graphic plots in Block 43, Block 60 also permits graphic plotting of various signal-processing parameters such as plots of time versus magnitude, time versus frequency, frequency versus magnitude, and frequency versus phase. Block 60 also permits printing the plotted figures or saving them in a file for future use. The data segment in the buffer can also be edited as depicted in FIG. 4 and the detailed description of this invention continues at Point D in FIG. 4.

Figure 4:
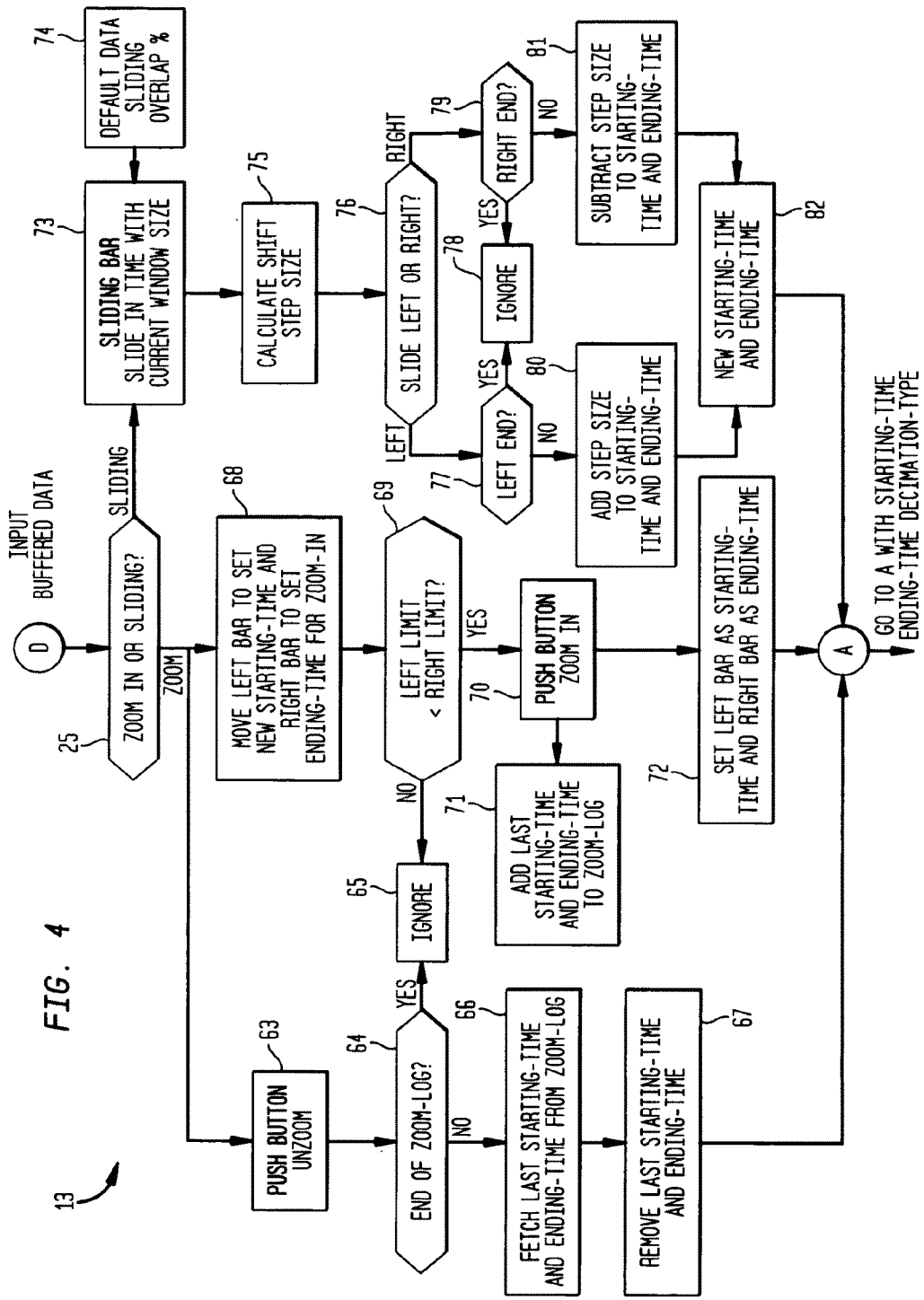
FIG. 4 is a computer programming flow chart including a number of GUI's and illustrating the process of zoom-in, zoom-out, and slide of the waveform plots.

Referring now to FIG. 4, the loading to buffer step 13 is illustrated in greater detail, including selections from a group plurality of editing features such as editing, zoom, unzoom, sliding left and sliding right of the signal waveform. Block 25 represents the selection of zoom in or sliding. When the user selects the zoom option, Block 68 allows setting the left time margin as the new starting-time and right time margin as the new ending-time for zooming-in, with the prior starting-time and the ending-time being stored in a storage variable file called zoom-log for un-zoom process represented by Block 71. The zoom time margin is selected manually by using the computer mouse and the right margin should not be less than the left margin, which is depicted as Left Limit<Right Limit in Block 69. Block 70 is a virtual PUSH BUTTON zoom in. If the unzoom option is selected, then PUSH BUTTON unzoom virtual button Block 63 will reset the current starting-time and the current ending-time to the prior starting-time and the previous ending-time, as depicted by Fetch Last Starting Time Block 66. This results in removing the previous starting-time and ending-time from zoom-log in Block 67. The unzoom process can be repeated until end of zoom-log is reached as depicted by Block 64.

If the sliding option is selected, the GUI SLIDING BAR Block 73 can shift the data waveform plot and Block 76 allows shifting the plot to either the left or the right. The sliding is bounded by the first and last data in the data file in Left End Block 77 and Right End Block 79. Whenever sliding to the right end is chosen, Subtract Step Size Block 81 subtracts a sliding step size from the current starting-time and current ending-time. By contrast, whenever the sliding to left end is chosen, Add Step Size Block 80 adds a sliding step size to the current starting-time and current ending-time. Block 82 represents sending the new starting-time and new ending-time to Point A of FIG. 3 to calculate the new adaptive decimation ratio.

The method of the present invention can also include a number of variations. For example variations such as repeating the calculating and loading steps as needed to achieve the necessary resolution, the step of analyzing real data, the step of calculating a real data decimation ratio $R_1$, the step of analyzing complex data, the step of calculating a complex data decimation ratio $R_2$ and so forth are considered within the contemplation of the present invention. Additionally, the methods of the present invention also contemplate rapidly analyzing and editing either data file samples or data signal samples with an adaptive decimation ratio. When the data file is a data signal file, the desired data segment is a desired waveform segment, the decimated data segment is a decimated waveform segment and the improved resolution data segment is an improved resolution data signal segment.

This invention also encompasses an apparatus for rapidly analyzing and editing data files with a number of GUI's and an adaptive decimation ratio in a computer. Referring now to FIGS. 2-4, the apparatus comprises a means for data storage that provides a data segment for loading into a limited sized working space buffer, a means for file format recognition, having a file format recognition POPUP MENU GUI in Block 30, for selecting a file name for the data segment, a means for file type recognition with a file type recognition POPUP MENU GUI 33 for a file type, a default parameter edit option in EDIT BLOCK GUI 34 displays a default data such as buffer size and sliding overlap size, while a means for file size detecting, having a file size DISPLAY BLOCK GUI 35, displays a file size for the data segment. A means for data display with a data virtual RADIO BUTTON GUI 37 displays a real data selection and a complex data selection and a means for sampling frequency editing and a means for default frequency editing permit selecting from a sampling frequency editing EDIT BLOCK GUI 38 and a default frequency editing EDIT BLOCK GUI 45. A means for decimation type selection, having a virtual RADIO BUTTON GUI 37, displays an auto-decimation selection and an edited decimation selection. When Edited-Decimation is chosen, the software's adaptive decimation will be disabled and the data segment will be decimated and loaded to the working space buffer with the given decimation ratio. When Auto-Decimation is selected, the decimation ratio will be calculated automatically using the real data equation (2) or the complex data equation (5) to ensure the decimated data loaded into the working space buffer in subsequent operations is distributed evenly in the data segment so that the entire waveform envelope may be viewed in a lower-resolution. After determining the data type and decimation type, a means for loading data with a loading virtual PUSH BUTTON GUI 41, loads the data segment to the buffer. Windows for plotting and analyzing data waveforms will then be generated on the computer screen in Block 43.

Referring now to FIG. 3, a means for calculation calculates the adaptive decimation ratio in Block 19A for real data or Block 19B for complex data. A plurality of data waveforms are plotted at point D and editing one of the waveforms generates an updated data segment starting-time, an updated data segment ending-time and a plurality of decimated data segments. The data loading means continually loads the plurality of decimated data segments and the Nyquist criterion DISPLAY BLOCK GUI's 61 and 62 provide a plurality of Nyquist selections. A means for decimation ratio display, having a display decimation ratio DISPLAY BLOCK GUI 56, displays the adaptive decimation ratio. Referring now to FIG. 4, a plurality of editing features, including a means for editing, a means for zooming, a means for unzooming, a means for sliding left and a means for sliding right are provided, with the zooming means being activated by a zoom-in virtual PUSH BUTTON GUI 70, the unzooming means being activated by an unzoom virtual PUSH BUTTON GUI 63 and the sliding left means and sliding right means being activated by a sliding bar virtual PUSH BUTTON GUI 73. The updated data segment starting-time and the updated data segment ending-time being readjusted in Block 82 and continually recalculating the adaptive decimation ratio as needed and further decimating the decimated data segments to provide an improved resolution data segment fitting into the working space buffer.

The present invention can be embodied in the form of computer-implemented processes and apparatuses for practicing those processes. The present invention can also be embodied in the form of computer program code embodied in tangible media, such a floppy diskettes, CD-ROM's, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling through fiber optics, or via electromagnetic radiation, wherein when the computer program code is loaded and executed by a computer, the computer becomes an apparatus for practicing the invention. When implemented on a generalpurpose microprocessor, the computer program code segments combine with the microprocessor to provide a unique device that operates analogously to specific logic circuits.

This invention also encompasses a storage medium encoded with machine-readable computer program code for rapidly analyzing and editing data files with a number of GUI's and an adaptive decimation ratio. Referring now to FIGS. 2-4, the storage medium comprises a means for computer data storage providing a data segment for loading into a limited sized working space buffer, a means for computer file format recognition, having a file format recognition POPUP MENU GUI in Block 30, a means for computer file type recognition with a file type recognition POPUP MENU GUI 33 and a default parameter edit option in EDIT BLOCK GUI 34 displays a default data such as buffer size and sliding overlap size. A means for computer file size detecting, having a file size DISPLAY BLOCK GUI 35, displays the file size and a means for data display with a data virtual RADIO BUTTON GUI 37 displays a real data selection and a complex data selection. A means for sampling frequency editing and a means for default frequency editing permit selecting from a sampling frequency editing EDIT BLOCK GUI 38 and a default frequency editing EDIT BLOCK GUI 45. A means for decimation type selection, having a virtual RADIO BUTTON GUI 37, displays auto-decimation and edited decimation selections. After determining the data type and decimation type, a means for loading computer data with a loading virtual PUSH BUTTON GUI 41, loads the data segment to the buffer. Windows for plotting and analyzing data waveforms will then be generated on the computer screen in Block 43.

Referring now to FIG. 3, a means for causing the computer to calculate calculates the adaptive decimation ratio in Block 19A for real data or Block 19B for complex data. A plurality of data waveforms are plotted at point D and a means for causing the computer to edit one of the waveforms generates an updated data segment starting-time, an updated data segment ending-time and a plurality of decimated data segments. The data loading means continually loads the plurality of decimated data segments. Nyquist criterion DISPLAY BLOCK GUI's 61 and 62 provide a plurality of Nyquist selections. A means for decimation ratio display, having a display decimation ratio DISPLAY BLOCK GUI 56, displays the adaptive decimation ratio. Referring now to FIG. 4, a number of editing features, such as a means for editing, a means for zooming, a means for unzooming, a means for sliding left and a means for sliding right are provided. The updated data segment starting-time and the updated data segment ending-time being readjusted in Block 82 and continually recalculating the adaptive decimation ratio as needed and further decimating the decimated data segments to provide an improved resolution data segment fitting into the working space buffer.

The variations in the method of the present invention can also apply to the and apparatus and computer program embodiments of this invention. The apparatus embodiment of this invention may be either a means for data processing, a computer or hardware.

Figure 5:
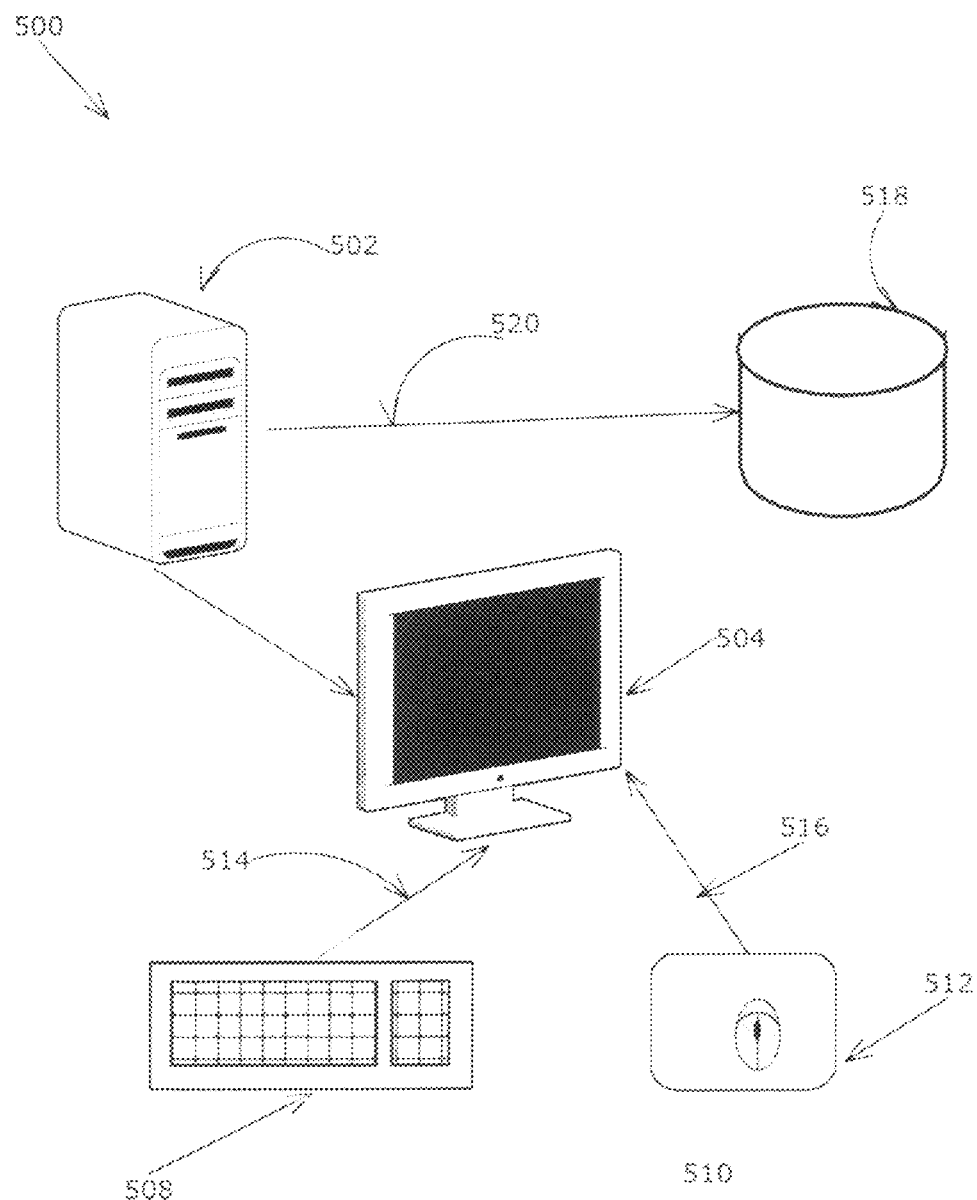
FIG. 5 is a representation of a computer system including a database for use in practicing the method of the present invention.

Referring to FIG. 5, a computer system 500 is shown that can be used to practice the method of the present invention. In one embodiment, the computer system 500 can include a desktop tower 502 that contains a microprocessor or CPU, random access memory RAM and a hard disk drive HDD for storing and/or operating application programs or data for use with the programs. A display 504 such as a liquid crystal display LCD is coupled to the desktop tower 502 as represented by line 506. A keyboard 508 and a mouse 510 on pad 512 are coupled to the display 504 as represented by lines 514 and 516, respectively. Also according to a preferred embodiment, a database 518 is shown coupled to the computer system as represented by line 520. The coupling lines can include cables or wireless connections including network hookups.

Figure 6:
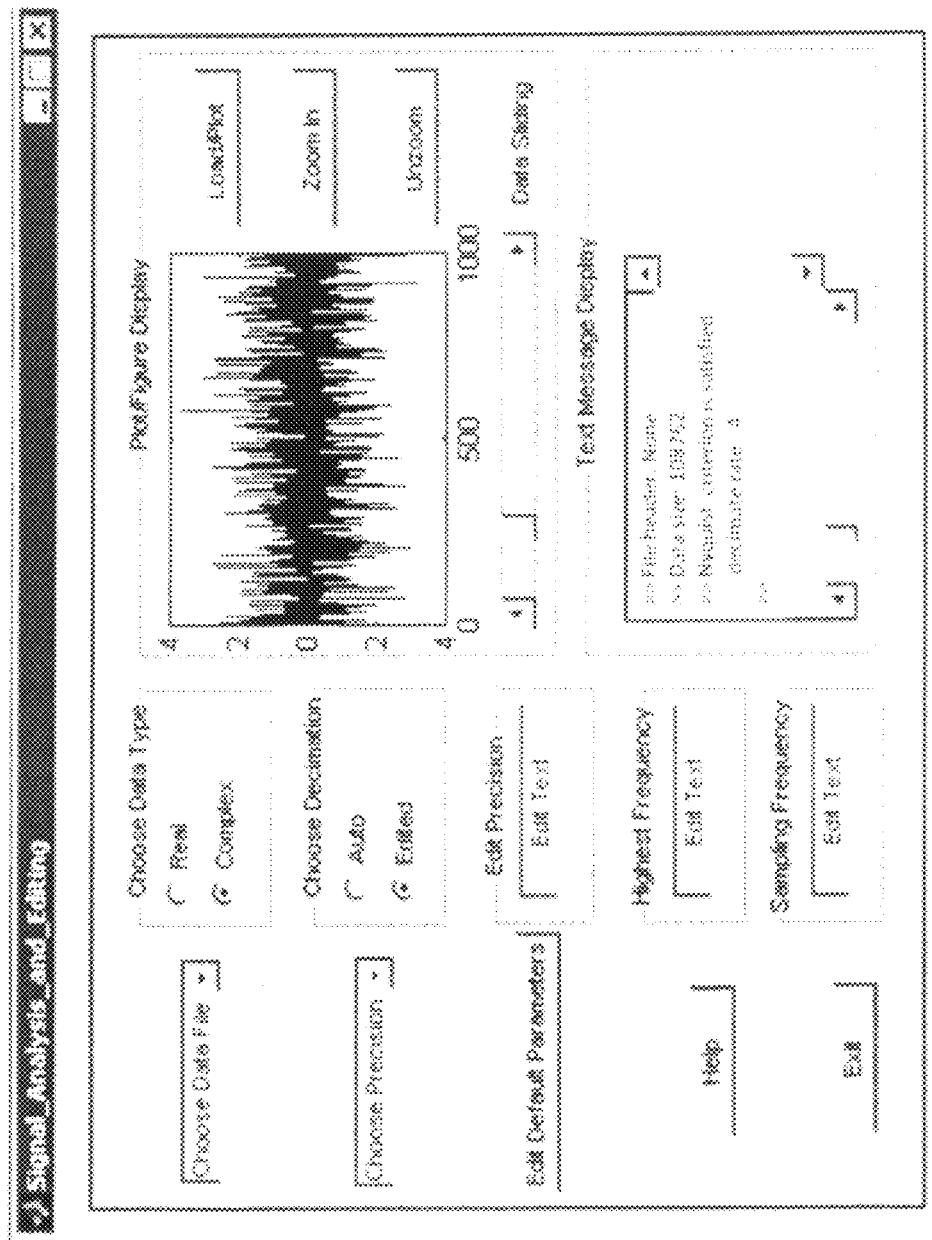
FIG. 6 is a representation of a Graphical User Interface for use in practicing the method of the present invention.

In FIG. 6, a graphic user interface (GUI) 600 is shown for use in practicing the present invention. In a preferred embodiment, the GUI 600 enables the user to interact with the GUI 600 which can be presented on the LCD display 504 of FIG. 5.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, arrangements and dimensions can achieve the results described herein, without departing from the spirit and scope of this invention. Accordingly, the present invention should not be limited by the foregoing description, but only by the appended claims.

What I claim is:

1. A method for rapidly analyzing and editing data files with a plurality of Graphical User Interfaces (GUI's) and an adaptive decimation ratio in a computer having a microprocessor and a display, comprising the steps of:
    selecting a data segment from a means for data storage for loading into a working space buffer having a limited size;
    selecting a file name from a file format recognition GUI;
    selecting a file type from a file type recognition GUI;
    providing a default parameter edit option GUI to display a plurality of default data further comprising a buffer size and a sliding overlap size;
    detecting a file size with a file size display GUI;
    choosing a data type with a data virtual radio button GUI displaying a real data selection and a complex data selection;
    selecting from a sampling frequency editing GUI and a default frequency editing GUI;
    clicking on a decimation type virtual radio button GUI displaying an auto-decimation selection and an edited decimation selection;
    loading said data segment to said working space buffer by clicking on a loading virtual radio button GUI;
    calculating said adaptive decimation ratio;
    plotting a plurality of data waveforms;
    editing one of said plurality of data waveforms generates an updated data segment starting-time, an updated data segment ending-time and a plurality of decimated data segments;
    continually loading said plurality of decimated data segments;
    selecting from a plurality of Nyquist criterion GUI's;
    displaying said automatically adjusted decimation ratio in a display decimation ratio GUI;
    selecting from a plurality of editing features further comprising an editing step, a zooming step, an unzooming step, a sliding left step and a sliding right step;
    said zooming step being activated by a zoom-in virtual button GUI, said unzooming step being activated by an unzoom virtual button GUI and said sliding left step and said sliding right step being activated by a sliding bar GUI;
    readjusting said updated data segment starting-time and said updated data segment ending-time; and continually recalculating said automatically adjusted decimation ratio as needed and further decimating said plurality of decimated data segments to provide an improved resolution data segment fitting into said working space buffer.

2. The method for rapidly analyzing and editing the data files with the plurality of GUI's and the automatically adjusted decimation ratio in the computer, as recited in claim 1, further comprising the steps of selecting an initial starting-time and an initial ending-time.

3. The method for rapidly analyzing and editing the data files with the plurality of GUI's and the automatically adjusted decimation ratio in the computer, as recited in claim 2, further comprising said initial starting-time and said initial ending-time defining said data segment.

4. The method for rapidly analyzing and editing the data files with the plurality of GUI's and the automatically adjusted decimation ratio in the computer, as recited in claim 3, further comprising the step of typing in a file precision-type when said file type recognition GUI is incomplete.

5. The method for rapidly analyzing and editing the data files with, the plurality of GUI's and the automatically adjusted decimation ratio in the computer, as recited in claim 4, further comprising said plurality of Nyquist criterion GUI's including a display Nyquist criterion not met GUI and a display Nyquist criterion cannot be checked GUI.

6. The method for rapidly analyzing and editing data files with the plurality of GUI's and the automatically adjusted decimation ratio in the computer, as recited in claim 5, further comprising the step of continually repeating said loading step whenever said plurality of decimated data segments are changed.

7. The method for rapidly analyzing and editing the data files with the plurality of GUI's and the automatically adjusted decimation ratio in the computer, as recited in claim 6, further comprising the steps of providing:
   a default parameter edit GUI;
   a help GUI; and
   an exit GUI.

8. The method for rapidly analyzing and editing the data files with the plurality of GUI's and the automatically adjusted decimation ratio in the computer, as recited in claim 7, further comprising the step of choosing said edited decimation selection.

9. The method for rapidly analyzing and editing the data files with the plurality of GUI's and the automatically adjusted decimation ratio in the computer, as recited in claim 8, further comprising the step of evenly distributing said plurality of decimated data segments when loading into said working space buffer.

10. The method for rapidly analyzing and editing the data files with the plurality of GUI's and the automatically adjusted decimation ratio in the computer, as recited in claim 9, further comprising the steps of:
   disabling an adaptive decimation software module;
   decimating said data segment; and
   loading said plurality of decimated data segments to said working space buffer with a given decimation ratio.

11. The method for rapidly analyzing and editing the data files with the plurality of GUI's and the automatically adjusted decimation ratio in the computer, as recited in claim 7, further comprising the steps of:
   choosing said auto-decimation selection; and
   enabling said auto-decimation selection to calculate said adaptive decimation ratio.

12. The method for rapidly analyzing and editing the data files with the plurality of GUI's and the automatically adjusted decimation ratio in the computer, as recited in claim 11, further comprising the step of rounding said adaptive decimation ratio to an integer.

13. The method for rapidly analyzing and editing the data files with the plurality of GUI's and the automatically adjusted decimation ratio in the computer, as recited in claim 12, further comprising the steps of:
   selecting said zooming step:
   said zooming step including setting a left time margin for said updated data segment starting-time;
   said zooming step including setting a right time margin for said updated data segment ending-time; and
   storing a plurality of prior starting-times and a plurality of prior ending-times in a storage variable file.

14. The method for rapidly analyzing and editing the data files with the plurality of GUI's and the automatically adjusted decimation ratio in the computer, as recited in claim 13, further comprising the steps of:
   selecting said unzooming step; and
   said unzoom virtual button GUI resetting said plurality of prior starting-times and said plurality of prior ending-times.

15. The method for rapidly analyzing and editing the data files with the plurality of GUI's and the automatically adjusted decimation ratio in the computer, as recited in claim 7, comprising the steps of:
   forming said data segment from real data; and
   calculating a real data decimation ratio $R_1$ according to the following equation:
   where $$R_1 = \begin{cases} 1 & \text{if } R_{10} = 0 \\ R_{10} & \text{if } R_{10} \geq 1 \end{cases}$$

where $$R_{10} = \text{ceil}\left(\frac{M}{W_1}\right) \quad W_1 = \text{floor}\left(\frac{W}{B}\right);$$

and
where said M is the number of data samples, said B is the number of bytes resolution per sample, and where an operator ceil(x) rounds the elements of x to the nearest integers towards infinity and an operator floor(x) rounds the input data x to the nearest integers towards minus infinity, and a buffer size W is defined by the user.

16. The method for rapidly analyzing and editing the data files with the plurality of GUI's and the automatically adjusted decimation ratio in the computer, as recited in claim 7, further comprising the steps of:
   forming said data segment from complex data; and
   denoting said complex data by an equation $d_{i1}+jd_{i2}$, in which i is the imaginary number, where said i=1, 2, ..., $L_2$ are integers and said $L_2$ is an even integer, with each of a plurality of data samples having a pair of elements according to the formula where q is a summation index:

$$d_{q,1}, d_{q,2}, d_{q+1,1}, d_{q+1,2}, \ldots, d_{q+N-1,1}, d_{q+N-1,2}, \quad q \geq 1,$$
$$q+N-1 < L_2, \text{ and } N >> 1; \text{ and}$$

providing an N number of complex data samples.

17. The method for rapidly analyzing and editing the data files with the plurality of GUI's and the automatically adjusted decimation ratio in the computer, as recited in claim 16, further comprising the step of calculating a complex data decimation ratio $R_2$ according to the following equation:

$$R_2 = \begin{cases} 1 & \text{if } R_{20} = 0 \\ R_{20} & \text{if } R_{20} \geq 1 \end{cases}$$

where $$R_{20} = \text{ceil}\left(\frac{N}{W_2}\right) \quad \left[W_2^{\boxtimes} = \text{floor}\left(\frac{W}{2B}\right)\right]$$

where said N is the number of data samples, said B is the number of bytes resolution per sample, and where an operator ceil(x) rounds the elements of x to the nearest integers towards infinity and an operator floor(x) rounds the input data x to the nearest integers towards minus infinity, and a buffer size W is defined by the user.

18. The method for rapidly analyzing and editing the data files with the plurality of GUI's and the automatically adjusted decimation ratio in the computer, as recited in claim 17, further comprising the steps of:

decimating an N-pair of complex samples to a $W_2$-pair of complex samples, and said N-pair of samples being defined by using indices p as a summation index according to the formula:

$$d_p, d_{p+1}, d_{p+2}, \ldots, d_{p+2N-1},$$

with said $p \geq 1$, $p+2N-1 \leq L_2$, and said $N \gg 1$; and providing said decimated data segment.

19. The method for rapidly analyzing and editing the data files with the plurality of GUI's and the automatically adjusted decimation ratio in the computer, as recited in claim 18, further comprising the steps of reading a real part of said data segment and an imaginary part of said data segment when said complex data selection has been chosen.

20. The method for rapidly analyzing and editing the data files with the plurality of GUI's and the automatically adjusted decimation ratio in the computer, as recited in claim 1, wherein said data segment is a data signal file.

21. The method for rapidly analyzing and editing the data files with the plurality of GUI's and the automatically adjusted decimation ratio in the computer, as recited in claim 20, further comprising:

said plurality of decimated data segments being a plurality of decimated waveform segments; and said improved resolution data segment is an improved resolution data signal segment.

22. The method for rapidly analyzing and editing the data files with the plurality of GUI's and the automatically adjusted decimation ratio in the computer, as recited in claim 21, further comprising the step of loading said complex data into 2 columns to the working space buffer from said updated data segment starting-time to said updated data segment ending-time with said adaptive decimation ratio.

23. An apparatus for rapidly analyzing and editing data files with a plurality of Graphical User Interfaces (GUI's) and an adaptive decimation ratio in a computer having a microprocessor and a display, comprising:

a means for data storage provides a data segment for loading into a working space buffer having a limited size;

a means for file format recognition, having a file format recognition GUI, permits selecting a file name for said data segment;

a means for file type recognition with a file type recognition GUI permits selecting a file type for said data segment;

a default parameter edit option GUI displays a plurality of default data further comprising a buffer size and a sliding overlap size;

a means for file size detecting, having a file size display GUI, displays a file size for said data segment;

a means for data display with a data virtual radio button GUI displays a real data selection and a complex data selection;

a means for sampling frequency editing and a means for default frequency editing allow selecting from a sampling frequency editing GUI and a default frequency editing GUI;

a means for decimation type selection, having a decimation type virtual radio button GUI, displays an auto-decimation selection and an edited decimation selection;

a means for loading data, having a loading virtual radio button GUI, loads said data segment to said working space buffer;

a means for calculation calculates said adaptive decimation ratio;

a plurality of data waveforms are plotted;

editing one of said plurality of data waveforms generates an updated data segment starting-time, an updated data segment ending-time and a plurality of decimated data segments;

said data loading means continually loads said plurality of decimated data segments;

a plurality of Nyquist criterion GUI's provide a plurality of Nyquist selections;

a means for decimation ratio display, having a display decimation ratio GUI, displays said adaptive decimation ratio;

a plurality of editing features further comprising a means for editing, a means for zooming, a means for unzooming, a means for sliding left and a means for sliding right, said zooming means being activated by a zoom-in virtual button GUI, said unzooming means being activated by an unzoom virtual button GUI and said sliding left means and said sliding right means being activated by a sliding bar GUI;

said updated data segment starting-time and said updated data segment ending-time being readjusted; and continually recalculating said adaptive decimation ratio as needed and further decimating said plurality of decimated data segments to provide an improved resolution data segment fitting into said working space buffer.

24. The apparatus for rapidly analyzing and editing data files with the plurality of GUI's and the adaptive decimation ratio in a computer, as recited in claim 23, further comprising selection of an initial starting-time and an initial ending-time.

25. The apparatus for rapidly analyzing and editing data files with the plurality of GUI's and the adaptive decimation ratio in a computer, as recited in claim 24, further comprising said initial starting-time and said initial ending-time defining said data segment.

26. The apparatus for rapidly analyzing and editing data files with the plurality of GUI's and the adaptive decimation ratio in a computer, as recited in claim 25, further comprising typing in a file precision-type when said file type recognition GUI is incomplete.

27. The apparatus for rapidly analyzing and editing the data files with the plurality of GUI's and the automatically adjusted decimation ratio in the computer, as recited in claim 26, further comprising said plurality of Nyquist criterion GUI's including a display Nyquist criterion not met GUI and a display Nyquist criterion cannot be checked GUI.

28. The apparatus for rapidly analyzing and editing data files with the plurality of GUI's and the adaptive decimation ratio in a computer, as recited in claim 27, further comprising continually loading whenever said plurality of decimated data segments are changed.

29. The apparatus for rapidly analyzing and editing data files with the plurality of GUI's and the adaptive decimation ratio in a computer, as recited in claim 28, further comprising a default parameter edit GUI, a help GUI and an exit GUI.

30. The apparatus for rapidly analyzing and editing data files with the plurality of GUI's and the adaptive decimation ratio in a computer, as recited in claim 29, further comprising choosing said edited decimation selection.

31. The apparatus for rapidly analyzing and editing data files with the plurality of GUI's and the adaptive decimation ratio in a computer, as recited in claim 30, further comprising evenly distributing said plurality of decimated data segments when loading into said working space buffer.

32. The apparatus for rapidly analyzing and editing data files with the plurality of GUI's and the adaptive decimation ratio in a computer, as recited in claim 31, further comprising:
  disabling an adaptive decimation software module;
  decimating said data segment; and
  loading said decimated data segment to said working space buffer with a given decimation ratio.

33. The apparatus for rapidly analyzing and editing data files with the plurality of GUI's and the adaptive decimation ratio in a computer, as recited in claim 29, further comprising:
  choosing said auto-decimation selection; and
  enabling said auto-decimation selection to calculate said adaptive decimation ratio.

34. The apparatus for rapidly analyzing and editing data files with the plurality of GUI's and the adaptive decimation ratio in a computer, as recited in claim 33, further comprising rounding said adaptive decimation ratio to an integer.

35. The apparatus for rapidly analyzing and editing data files with the plurality of GUI's and the adaptive decimation ratio in a computer, as recited in claim 34, further comprising said zooming means including setting a left time margin for said updated data segment starting-time, setting a right time margin for said updated data segment ending-time and having a storage variable file to store a plurality of prior starting-times and a plurality of prior ending-times.

36. The apparatus for rapidly analyzing and editing data files with the plurality of GUI's and the adaptive decimation ratio in a computer, as recited in claim 35, further comprising said unzoom virtual button GUI resetting said plurality of prior starting-times and said plurality of prior ending-times.

37. The apparatus for rapidly analyzing and editing data files with the plurality of GUI's and the adaptive decimation ratio in a computer, as recited in claim 29, further comprising:
  said data segment being real data; and
  calculating a real data decimation ratio $R_1$ according to the following equation:
  where $$R_1 = \begin{cases} 1 & \text{if } R_{10} = 0 \\ R_{10} & \text{if } R_{10} \geq 1 \end{cases}$$

where $$R_{10} = \text{ceil}\left(\frac{M}{W_1}\right) \quad W_1 = \text{floor}\left(\frac{W}{B}\right);$$

and
where said M is the number of data samples, said B is the number of bytes resolution per sample, and where an operator ceil(x) rounds the elements of x to the nearest integers towards infinity and an operator floor(x) rounds the input data x to the nearest integers towards minus infinity, and a buffer size W is defined by the user.

38. The apparatus for rapidly analyzing and editing data files with the plurality of GUI's and the adaptive decimation ratio in a computer, as recited in claim 29, further comprising:
  said data segment being complex data; and
  denoting said complex data by an equation $d_{i1}+jd_{i2}$, in which j is the imaginary number, where said $i=1, 2, \ldots, L_2$ are integers and said $L_2$ is an even integer, with each of a plurality of data samples having a pair of elements according to the formula where q is a summation index:

$$d_{q,1}, d_{q,2}, d_{q+1,1}, d_{q+1,2}, \ldots, d_{q+N-1,1}, d_{q+N-1,2}, \; q \geq 1,$$
$$q+N-1 \leq L_2, \text{ and } N \gg 1; \text{ and}$$

providing an N number of complex data samples.

39. The apparatus for rapidly analyzing and editing data files with the plurality of GUI's and the adaptive decimation ratio in a computer, as recited in claim 38, further comprising calculating a complex data decimation ratio $R_2$ according to the following equation:

$$R_2 = \begin{cases} 1 & \text{if } R_{20} = 0 \\ R_{20} & \text{if } R_{20} \geq 1 \end{cases}$$

where $$R_{20} = \text{ceil}\left(\frac{N}{W_2}\right) \quad W_2 = \text{floor}\left(\frac{W}{2B}\right)$$

where said N is the number of data samples, said B is the number of bytes resolution per sample, and where an operator ceil(x) rounds the elements of x to the nearest integers towards infinity and an operator floor(x) rounds the input data x to the nearest integers towards minus infinity, and a buffer size W is defined by the user.

40. The apparatus for rapidly analyzing and editing data files with the plurality of GUI's and the adaptive decimation ratio in a computer, as recited in claim 39, further comprising:
  an N-pair of complex samples being decimated to a $W_2$-pair of complex samples, and said N-pair of samples being defined by using indices p as a summation index according to the formula:

$$d_p, d_{p+1}, d_{p+2}, \ldots, d_{p+2N-1},$$

with said $p \geq 1$, $p+2N-1 \leq L_2$, and $N \gg 1$; and
providing said decimated data segment.

41. The apparatus for rapidly analyzing and editing data files with the plurality of GUI's and the adaptive decimation ratio in a computer, as recited in claim 40, further comprising reading a real part of said data segment and an imaginary part of said data segment when said complex data selection has been chosen.

42. The apparatus for rapidly analyzing and editing data files with the plurality of GUI's and the adaptive decimation ratio in a computer, as recited in claim 23, further comprising said data segment being a data signal file.

43. The apparatus for rapidly analyzing and editing data files with the plurality of GUI's and the adaptive decimation ratio in a computer, as recited in claim 42, further comprising:
said plurality of decimated data segments being a plurality of decimated waveform segments; and
said improved resolution data segment is an improved resolution data signal segment.

44. The apparatus for rapidly analyzing and editing data files with the plurality of GUI's and the adaptive decimation ratio in a computer, as recited in claim 43, further comprising loading said complex data into 2 columns to the working space buffer from said updated data segment starting-time to said updated data segment ending-time with said adaptive decimation ratio.

45. A storage medium encoded with machine-readable computer program code for rapidly analyzing and editing data files with a plurality of Graphical User Interfaces (GUI's) and an adaptive decimation ratio, comprising:
a means for computer data storage provides a data segment for loading into a working space buffer in a computer having a limited size;
a means for computer file format recognition, having a file format recognition GUI, permits selecting a file name for said data segment;
a means for computer file type recognition with a file type recognition GUI permits selecting a file type for said data segment;
a default parameter edit option GUI displays a plurality of default data further comprising a computer buffer size and a sliding overlap size;
a means for computer file size detecting, having a file size display GUI, displays a file size for said data segment;
a means for data display with a data virtual radio button GUI displays a real data selection and a complex data selection;
a means for sampling frequency editing and a means for default frequency editing allow selecting from a sampling frequency editing GUI and a default frequency editing GUI;
a means for decimation type selection, having a decimation type virtual radio button GUI, displays an auto-decimation selection and an edited decimation selection;
a means for loading computer data, having a loading virtual radio button GUI, loads said data segment to said working space buffer;
a means for causing the computer to calculate calculates said adaptive decimation ratio;
a plurality of data waveforms are plotted;
a means for causing the computer to edit one of said plurality of data waveforms generates an updated data segment starting-time, an updated data segment ending-time and a plurality of decimated data segments;
said data loading means continually loads said plurality of decimated data segments;
a plurality of Nyquist criterion GUI's provide a plurality of Nyquist selections;
a means for decimation ratio display, having a display decimation ratio GUI, displays said adaptive decimation ratio;
a plurality of editing features further comprising a means for editing, a means for zooming, a means for unzooming, a means for sliding left and a means for sliding right, said zooming means being activated by a zoom-in virtual button GUI, said unzooming means being activated by an unzoom virtual button GUI and said sliding left means and said sliding right means being activated by a sliding bar GUI;
said updated data segment starting-time and said updated data segment ending-time being readjusted; and
continually recalculating said adaptive decimation ratio as needed and further decimating said plurality of decimated data segments to provide an improved resolution data segment fitting into said working space buffer.

46. The storage medium encoded with machine-readable computer to program code for rapidly analyzing and editing data files with a plurality of GUI's and the adaptive decimation ratio, as recited in claim 45, further comprising selection of an initial starting-time and an initial ending-time.

47. The storage medium encoded with machine-readable computer program code for rapidly analyzing and editing data files with a plurality of GUI's and the adaptive decimation ratio, as recited in claim 46, further comprising said initial starting-time and said initial ending-time defining said data segment.

48. The storage medium encoded with machine-readable computer program code for rapidly analyzing and editing data files with a plurality of GUI's and the adaptive decimation ratio, as recited in claim 47, further comprising typing in a file precision-type when said file type recognition GUI is incomplete.

49. The storage medium encoded with machine-readable computer program code for rapidly analyzing and editing data files with a plurality of GUI's and the adaptive decimation ratio, as recited in claim 48, further comprising said plurality of Nyquist criterion GUI's including a display Nyquist criterion not met GUI and a display Nyquist criterion cannot be checked GUI.

50. The storage medium encoded with machine-readable computer program code for rapidly analyzing and editing data files with a plurality of GUI's and the adaptive decimation ratio, as recited in claim 49, further comprising continually loading whenever said plurality of decimated data segments are changed.

51. The storage medium encoded with machine-readable computer program code for rapidly analyzing and editing data files with a plurality of GUI's and the adaptive decimation ratio, as recited in claim 50, further comprising a default parameter edit GUI, a help GUI and an exit GUI.

52. The storage medium encoded with machine-readable computer program code for rapidly analyzing and editing data files with a plurality of GUI's and the adaptive decimation ratio, as recited in claim 51, further comprising choosing said edited decimation selection.

53. The storage medium encoded with machine-readable computer program code for rapidly analyzing and editing data files with a plurality of GUI's and the adaptive decimation ratio, as recited in claim 52, further comprising evenly distributing said plurality of decimated data segments when loading into said working space buffer.

54. The storage medium encoded with machine-readable computer program code for rapidly analyzing and editing data files with a plurality of GUI's and the adaptive decimation ratio, as recited in claim 53, further comprising:
disabling an adaptive decimation software module;
decimating said data segment; and
loading said decimated data segment to said working space buffer with a given decimation ratio.

55. The storage medium encoded with machine-readable computer program code for rapidly analyzing and editing data files with a plurality of GUI's and the adaptive decimation ratio, as recited in claim 51, further comprising:
choosing said auto-decimation selection; and
enabling said auto-decimation selection to calculate said adaptive decimation ratio.

56. The storage medium encoded with machine-readable computer program code for rapidly analyzing and editing data files with a plurality of GUI's and the adaptive decimation ratio, as recited in claim 55, further comprising rounding said adaptive decimation ratio to an integer.

57. The storage medium encoded with machine-readable computer program code for rapidly analyzing and editing data files with a plurality of GUI's and the adaptive decimation ratio, as recited in claim 56, further comprising said zooming means including setting a left time margin for said updated data segment starting-time, setting a right time margin for said updated data segment ending-time and having a storage variable file to store a plurality of prior starting-times and a plurality of prior ending-times.

58. The storage medium encoded with machine-readable computer program code for rapidly analyzing and editing data files with a plurality of GUI's and the adaptive decimation ratio, as recited in claim 57, further comprising said unzoom virtual button GUI resetting said plurality of prior starting-times and said plurality of prior ending-times.

59. The storage medium encoded with machine-readable computer program code for rapidly analyzing and editing data files with a plurality of GUI's and the adaptive decimation ratio, as recited in claim 51, further comprising:
said data segment being real data; and
calculating a real data decimation ratio $R_1$ according to the following equation:

$$R_1 = \begin{cases} 1 & \text{if } R_{10} = 0 \\ R_{10} & \text{if } R_{10} \geq 1 \end{cases}$$

where $$R_{10} = \text{ceil}\left(\frac{M}{W_1}\right) \quad W_1 = \text{floor}\left(\frac{W}{B}\right);$$

and
where said M is the number of data samples, said B is the number of bytes resolution per sample, and where an operator ceil(x) rounds the elements of x to the nearest integers towards infinity and an operator floor(x) rounds the input data x to the nearest integers towards minus infinity, and a buffer size W is defined by the user.

60. The storage medium encoded with machine-readable computer program code for rapidly analyzing and editing data files with a plurality of GUI's and the adaptive decimation ratio, as recited in claim 51, further comprising:
said data segment being complex data; and
denoting said complex data by an equation $d_{i1}+jd_{i2}$, in which i is the imaginary number where said i=1, 2, ..., $L_2$ are integers and said $L_2$ is an even integer, with each of a plurality of data samples having a pair of elements according to the formula where q is a summation index:

$$d_{q,1}, d_{q,2}, d_{q+1,1}, d_{q+1,2}, \ldots, d_{q+N-1,2}, d_{q+N-1,2}, q \geq 1,$$
$$q+N-1 \leq L_2, \text{ and } N >> 1; \text{ and}$$

providing an N number of complex data samples.

61. The storage medium encoded with machine-readable computer program code for rapidly analyzing and editing data files with a plurality of GUI's and the adaptive decimation ratio, as recited in claim 60, further comprising calculating a complex data decimation ratio $R_2$ according to the following equation:

$$R_2 = \begin{cases} 1 & \text{if } R_{20} = 0 \\ R_{20} & \text{if } R_{20} \geq 1 \end{cases}$$

where $$R_{20} = \text{ceil}\left(\frac{N}{W_2}\right) \quad W_2 = \text{floor}\left(\frac{W}{2B}\right)$$

where said N is the number of data samples, said B is the number of bytes resolution per sample, and where an operator ceil(x) rounds the elements of x to the nearest integers towards infinity and an operator floor(x) rounds the input data x to the nearest integers towards minus infinity, and a buffer size W is defined by the user.

62. The storage medium encoded with machine-readable computer program code for rapidly analyzing and editing data files with a plurality of GUI's and the adaptive decimation ratio, as recited in claim 61, further comprising:
an N-pair of complex samples being decimated to a $W_2$-pair of complex samples, and said N-pair of samples being defined by using indices p as a summation index according to the formula:

$$d_p, d_{p+1}, d_{p+2}, \ldots, d_{p+2N-1},$$

with said $p \geq 1$, $p+2N-1 \leq L_2$, and said $N >> 1$; and
providing said decimated data segment.

63. The storage medium encoded with machine-readable computer program code for rapidly analyzing and editing data files with a plurality of GUI's and the adaptive decimation ratio, as recited in claim 62, further comprising reading a real part of said data segment and an imaginary part of said data segment when said complex data selection has been chosen.

64. The storage medium encoded with machine-readable computer program code for rapidly analyzing and editing data files with a plurality of GUI's and the adaptive decimation ratio, as recited in claim 45, further comprising said data segment being a data signal file.

65. The storage medium encoded with machine-readable computer program code for rapidly analyzing and editing data files with a plurality of GUI's and the adaptive decimation ratio, as recited in claim 64, further comprising:
said plurality of decimated data segments being a plurality of decimated waveform segments; and
said improved resolution data segment is an improved resolution data signal segment.

66. The storage medium encoded with machine-readable computer program code for rapidly analyzing and editing data files with a plurality of GUI's and the adaptive decimation ratio, as recited in claim 65, further comprising loading said complex data into 2 columns to the working space buffer from said updated data segment starting-time to said updated data segment ending-time with said adaptive decimation ratio.

* * * * *